US012610484B2

(12) United States Patent
Kim et al.

(10) Patent No.: US 12,610,484 B2
(45) Date of Patent: Apr. 21, 2026

(54) DISPLAY DEVICE

(71) Applicant: LG ELECTRONICS INC., Seoul (KR)

(72) Inventors: Yunjoo Kim, Seoul (KR); Yuonui Chong, Seoul (KR); Jaeneung Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/881,624

(22) PCT Filed: Jul. 19, 2022

(86) PCT No.: PCT/KR2022/010484
§ 371 (c)(1),
(2) Date: Jan. 6, 2025

(87) PCT Pub. No.: WO2024/014595
PCT Pub. Date: Jan. 18, 2024

(65) Prior Publication Data
US 2025/0318062 A1      Oct. 9, 2025

(30) Foreign Application Priority Data
Jul. 13, 2022     (KR) ........................ 10-2022-0086411

(51) Int. Cl.
*H05K 5/02*          (2006.01)
(52) U.S. Cl.
CPC ......... *H05K 5/0234* (2013.01); *H05K 5/0221* (2013.01)

(58) Field of Classification Search
CPC ........................... H05K 5/0234; H05K 5/0221
USPC ................................. 361/807, 809, 810, 801
See application file for complete search history.

(56) References Cited

U.S. PATENT DOCUMENTS

| | | | | |
|---|---|---|---|---|
| 2002/0135975 A1* | 9/2002 | Schmidt | .................... | G06F 1/16 |
| | | | | 248/917 |
| 2006/0114662 A1* | 6/2006 | Liu | ......................... | H05K 7/142 |
| | | | | 361/759 |
| 2011/0058322 A1* | 3/2011 | Lee | ......................... | F16M 11/10 |
| | | | | 361/679.01 |
| 2011/0310555 A1* | 12/2011 | Yamamoto | ......... | H05K 7/20963 |
| | | | | 361/688 |

FOREIGN PATENT DOCUMENTS

| | | |
|---|---|---|
| KR | 10-2006-0071051 A | 6/2006 |
| KR | 10-2009-0075386 A | 7/2009 |

(Continued)

*Primary Examiner* — Hung S. Bui
(74) *Attorney, Agent, or Firm* — Birch, Stewart, Kolasch & Birch, LLP

(57) ABSTRACT

A display device including a stand that can be easily fastened and stably supported, is characterized by comprising: a display module; a cover bottom located on the rear of the display module; a stand fastening hole formed in the cover bottom; a stand including a stand fastening protrusion inserted into the stand fastening hole; and a locking member in which the stand fastening hole secures the stand fastening protrusion, wherein the stand fastening hole is larger than the stand fastening protrusion, and the locking member fills a gap between the stand fastening protrusion and the stand fastening hole.

8 Claims, 12 Drawing Sheets

(56)  References Cited

FOREIGN PATENT DOCUMENTS

| | | | |
|---|---|---|---|
| KR | 10-2010-0073607 | A | 7/2010 |
| KR | 10-2017-0046467 | A | 5/2017 |
| KR | 10-2039143 | B1 | 10/2019 |
| KR | 10-2021-0086372 | A | 7/2021 |

* cited by examiner (a)

(b)

338         329

( a )

338         339

( b )

328         339

( c )

338   339

( d )

( a )

( b )

(a)

(b)

DISPLAY DEVICE

CROSS REFERENCE TO RELATED APPLICATIONS

This application is the National Phase of PCT International Application No. PCT/KR2022/010484, filed on Jul. 19, 2022, which claims priority under 35 U.S.C. 119 (a) to Patent Application No. 10-2022-0086411, filed in the Republic of Korea on Jul. 13, 2022, all of which are hereby expressly incorporated by reference into the present application.

TECHNICAL FIELD

The present disclosure relates to a display device having a stand that may stably support a main body with a great area size.

BACKGROUND

With growth of information society, demand for various display devices has increased. In order to satisfy such demand, in recent years, a liquid crystal display (LCD), a field emission display (FED), a plasma display panel (PDP), and an electroluminescent device have been developed as display devices.

A liquid crystal panel of the liquid crystal display includes a liquid crystal layer and a TFT substrate and a color filter substrate opposite each other in the state in which the liquid crystal layer is interposed therebetween, wherein a picture is displayed using light provided from a backlight unit.

An active matrix type organic light-emitting display has come onto the market as an example of the electroluminescent device. Since the organic light-emitting display is self-emissive, the organic light-emitting display has no backlight, compared to the liquid crystal display, and has merits in terms of response time and viewing angle, and therefore the organic light-emitting display has attracted attention as a next-generation display.

As a size of the display device gets smaller, a stand that supports a main body also becomes simpler and lighter in structure, and a design that enables easy fastening while stably supporting the main body with a great area size at the same time is required.

SUMMARY

Technical Problem

The present disclosure aims to provide a display device equipped with a stand that may stably support a main body with a great area size.

Technical Solutions

Provided is a display device including a display module, a cover bottom positioned on a rear surface of the display module, a stand fastening hole defined in the cover bottom, a stand including a stand fastening protrusion inserted into the stand fastening hole, and a locking member fixing the stand fastening protrusion to the stand fastening hole, wherein the stand fastening hole is greater in size than the stand fastening protrusion, wherein the locking member fills a gap between the stand fastening protrusion and the stand fastening hole. The locking member may include a slide block located on a front surface of the cover bottom and partially covering the stand fastening hole, and a locking button that moves the slide block in a vertical direction, the stand fastening hole may be larger than the stand fastening protrusion when the slide block moves downward, and the stand fastening hole may be smaller than the stand fastening protrusion when the slide block moves upward.

The stand fastening hole, the stand fastening protrusion, and the slide block may include a plurality of stand fastening holes, a plurality of stand fastening protrusions, and a plurality of slide blocks, respectively, the locking member may include a moving frame connecting the plurality of slide blocks to each other, and the locking button may be connected to the moving frame and move the plurality of slide blocks simultaneously.

The display device may further include a return spring having one side fixed to the cover bottom and the other side fixed to the moving frame, when the locking button is pressed, a shape of the return spring may change and the slide block may move downward, and when the force of pressing the locking button is removed, the return spring may be restored to an original shape thereof and the slide block may move upward. The display device may further include a guide slot extending in the vertical direction in the frame, and a guide protrusion protruding in a direction of the front surface of the cover bottom and inserted into the guide slot.

The locking button may include a switch protrusion protruding in a direction of a rear surface of the cover bottom, and the locking member may further include a stopper supporting a lower portion of the switch protrusion to maintain the slide block in the upwardly moved state.

The locking member may include a fixing protrusion positioned below the stand fastening protrusion, and a locking button that inserts and withdraws the fixing protrusion into and from a front surface of the stand, and the fixing protrusion may be inserted into the stand fastening hole while filling a gap between the stand fastening protrusion and the stand fastening hole.

The display device may further include a return spring that presses the fixing protrusion such that the fixing protrusion protrudes from the front surface of the stand, when the locking button is pressed, the return spring may be compressed and the fixing protrusion may be inserted into the stand, and when the force of pressing the locking button is removed, the return spring may be restored to an original shape thereof and the fixing protrusion may protrude from the front surface of the stand.

The stand fastening hole, the stand fastening protrusion, and the fixing protrusion may include a plurality of stand fastening holes, a plurality of stand fastening protrusions, and a plurality of fixing protrusions, the locking member may include a moving frame connecting the plurality of fixing protrusions to each other, and the locking button may be connected to the moving frame and move the plurality of fixing protrusions simultaneously.

The stand fastening protrusion may further include a head having a great diameter at an end thereof, and the stand fastening hole may include an insertion portion with a size greater than a horizontal size of the head.

The stand fastening hole and the stand fastening protrusion may include a plurality of stand fastening holes and a plurality of stand fastening protrusions, respectively, and the number of stand fastening holes may be greater than the number of stand fastening protrusions, the plurality of stand fastening holes may include a first fastening hole fastened to one of the plurality of stand fastening protrusions, and a second fastening hole not fastened to any of the plurality of stand fastening protrusions, and the second fastening hole may be located above or below the first fastening hole.

The stand may include a base in contact with a floor surface, a support extending forward obliquely from the base, and a bracket located at an upper end of the support and having the stand fastening protrusion formed thereon.

Advantageous Effects

The display device of the present disclosure includes the stand that may be easily fastened and provide the stable support.

Effects obtainable from the present embodiments are not limited by the above mentioned effects, and other unmentioned effects can be clearly understood from the above description by those having ordinary skill in the technical field to which the present disclosure pertains.

BEST MODE

Figure 1:
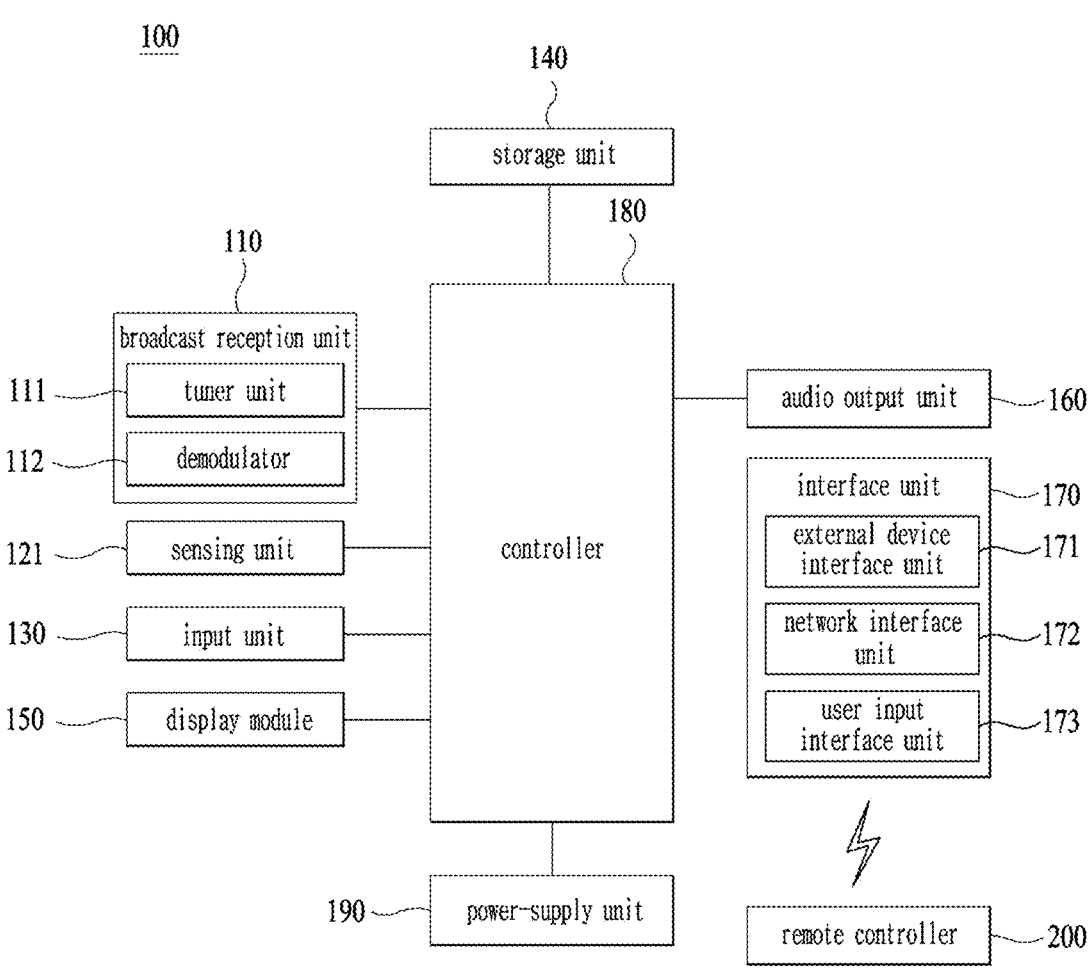
FIG. 1 is a block diagram illustrating components of a display device according to the present disclosure.

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Meanwhile, an image display device described in this specification is, for example, an intelligent image display device having a computer supporting function in addition to a broadcast reception function, wherein an Internet function may be added while the broadcast reception function is devotedly performed, whereby an interface that is more conveniently used, such as a handwriting type input device, a touchscreen, or a space remote control, may be provided. In addition, the image display device may be connected to the Internet or a computer through support of a wired or wireless Internet function, whereby various functions, such as e-mail, web browsing, banking, or gaming, may be executed. For such various functions, a standardized general-purpose OS may be used.

In the image display device described in the present disclosure, therefore, various applications may be freely added or deleted, for example, on a general-purpose OS kernel, whereby various user friendly functions may be executed. More specifically, the image display device may be a network TV, an Hbb TV, or a smart TV, and is applicable to a smartphone depending on circumstances.

FIG. 1 is a block diagram illustrating components of a display device 100. The display device 100 may include a broadcast reception unit 110, an external device interface unit 171, a network interface unit 172, a storage unit 140, a user input interface unit 173, an input unit 130, a controller 180, a display module 150, an audio output unit 160, and/or a power supply unit 190.

The broadcast reception unit 110 may include a tuner unit 111 and a demodulation unit 112.

Unlike the figure, on the other hand, the display device 100 may include only the external device interface unit 171 and the network interface unit 172, among the broadcast reception unit 110, the external device interface unit 171, and the network interface unit 172. That is, the display device 100 may not include the broadcast reception unit 110.

The tuner unit 111 may select a broadcast signal corresponding to a channel selected by a user or any one of all pre-stored channels, among broadcast signals received through an antenna (not shown) or a cable (not shown). The tuner unit 111 may convert the selected broadcast signal into an intermediate frequency signal or a baseband video or audio signal.

For example, when the selected broadcast signal is a digital broadcast signal, the tuner unit 111 may convert the broadcast signal into a digital IF (DIF) signal, and when the selected broadcast signal is an analog broadcast signal, the tuner unit 111 may convert the broadcast signal into an analog baseband video or audio (CVBS/SIF) signal. That is, the tuner unit 111 may process the digital broadcast signal or the analog broadcast signal. The analog baseband video or audio (CVBS/SIF) signal output from the tuner unit 111 may be directly input to the controller 180.

Meanwhile, the tuner unit 111 may sequentially select broadcast signals of all broadcast channels stored through a channel memory function, among received broadcast signals, and may convert each of the selected broadcast signals into an intermediate frequency signal or a baseband video or audio signal.

Meanwhile, the tuner unit 111 may include a plurality of tuners in order to receive broadcast signals of a plurality of channels. Alternatively, a single tuner may simultaneously receive broadcast signals of a plurality of channels.

The demodulation unit 112 may receive the digital IF (DIF) signal converted by the tuner unit 111, and may perform demodulation. After performing demodulation and channel decryption, the demodulation unit 112 may output a stream signal (TS). At this time, the stream signal may be a multiplexed image, audio, or data signal.

The stream signal output from the demodulation unit 112 may be input to the controller 180. After performing demultiplexing and image/audio signal processing, the controller 180 may output an image through the display module 150, and may output audio through the audio output unit 160.

The sensing unit 120 is a device configured to sense change inside or outside the display device 100. For example, the sensing unit 120 may include at least one of a proximity sensor, an illumination sensor, a touch sensor, an infrared (IR) sensor, an ultrasonic sensor, an optical sensor (e.g. a camera), an audio sensor (e.g. a microphone), a battery gauge, and an environmental sensor (e.g. a hygrometer or a thermometer).

The controller 180 may check the state of the display device 100 based on information collected by the sensing unit, and when a problem occurs, may inform a user of the same or may solve the problem, whereby the controller may perform control such that the display device is maintained in the best state.

In addition, the controller may differently control the content, quality, and size of an image provided to the display module 150 based on a viewer or ambient light sensed by the sensing unit in order to provide the optimum viewing environment. With progress of a smart TV, a large number of functions have been loaded in the display device, and the sensing unit 20 has also been increased in number.

The input unit 130 may be provided at one side of a main body of the display device 100. For example, the input unit 130 may include a touchpad or a physical button. The input unit 130 may receive various user commands related to the operation of the display device 100, and may transmit control signals corresponding to the received commands to the controller 180.

With a decrease in size of a bezel of the display device 100, many display devices 100 have been configured such that the number of physical button type input units 130 exposed to the outside is minimized in recent years. Instead, a minimum number of physical buttons is located at the rear surface or the side surface of the display device, and the display device may receive user input through the touchpad or the user input interface unit 173, a description of which will follow, using a remote controller 200.

The storage unit 140 may store programs for signal processing and control in the controller 180, and may store a processed image, audio, or data signal. For example, the storage unit 140 may store application programs designed to execute various tasks that can be processed by the controller 180, and may selectively provide some of the stored application programs in response to request of the controller 180.

Programs stored in the storage unit 140 are not particularly restricted as long as the programs can be executed by the controller 180. The storage unit 140 may temporarily store an image, audio, or data signal received from an external device through the external device interface unit 171. The storage unit 140 may store information about a predetermined broadcast channel through a channel memory function, such as a channel map.

FIG. 1 shows an embodiment in which the storage unit 140 and the controller 180 are separately provided; however, the present disclosure is not limited thereto. The storage unit 140 may be included in the controller 180.

The storage unit 140 may include at least one of a volatile memory (e.g. DRAM, SRAM, or SDRAM), a nonvolatile memory (e.g. flash memory), a hard disk drive (HDD), and a solid-state drive (SSD).

The display module 150 may convert an image signal, a data signal, an OSD signal, and a control signal processed by the controller 180 or an image signal, a data signal, and a control signal received from the interface unit 171 to generate a driving signal. The display module 150 may include a display panel 181 having a plurality of pixels.

Each of the plurality of pixels in the display panel may include RGB subpixels. Alternatively, each of the plurality of pixels in the display panel may include RGBW subpixels. The display module 150 may convert an image signal, a data signal, an OSD signal, and a control signal processed by the controller 180 to generate a driving signal for the plurality of pixels.

A plasma display panel (PDP), a liquid crystal display (LCD), an organic light-emitting diode (OLED), or a flexible display may be used as the display module 150, and a 3D display may also be used. The 3D display 130 may be classified as a non-glasses type display or a glasses type display.

The display device includes a display module, which occupies a major portion of the front surface thereof, and a case configured to cover the rear surface and the side surface of the display module, the case being configured to package the display module.

In recent years, the display device 100 has used a flexible display module 150, such as light-emitting diodes (LED) or organic light-emitting diodes (OLED), in order to implement a curved screen.

Light is supplied to an LCD, which was mainly used conventionally, through a backlight unit, since the LCD is not self-emissive. The backlight unit is a device that supplies light emitted from a light source to a liquid crystal uniformly located in front thereof. As the backlight unit has been gradually thinned, a thin LCD has been implemented. However, it is difficult to implement the backlight unit using a flexible material. If the backlight unit is curved, it is difficult to supply uniform light to the liquid crystal, whereby the brightness of a screen is changed.

In contrast, the LED or the OLED may be implemented so as to be curved, since an element constituting each pixel is self-emissive, and therefore no backlight unit is used. In addition, since each element is self-emissive, the brightness of the element is not affected even though the positional relationship between adjacent elements is changed, and therefore it is possible to implement a curved display module 150 using the LED or the OLED.

An organic light-emitting diode (OLED) panel appeared in earnest in mid 2010and has rapidly replaced the LCD in the small-or medium-sized display market. The OLED is a display manufactured using a self-emissive phenomenon of an organic compound in which the organic compound emits light when current flows in the organic compound. The response time of the OLED is shorter than the response time of the LCD, and therefore afterimages hardly appear when video is implemented.

The OLED is an emissive display product that uses three fluorescent organic compounds having a self-emissive function, such as red, green, and blue fluorescent organic compounds and that uses a phenomenon in which electrons injected at a negative electrode and a positive electrode and particles having positive charges are combined in the organic compounds to emit light, and therefore a backlight unit, which deteriorates color, is not needed.

A light-emitting diode (LED) panel is based on technology of using one LED element as one pixel. Since it is possible to reduce the size of the LED element, compared to a conventional device, it is possible to implement a curved display module 150. The conventional device, which is called an LED TV, uses the LED as a light source of a backlight unit that supplies light to the LCD, and therefore the LED does not constitute a screen.

The display module includes a display panel and a coupling magnet, a first power supply unit, and a first signal module located at a rear surface of the display panel. The display panel may include a plurality of pixels R. G, and B. The plurality of pixels R. G, and B may be formed at intersections between a plurality of data lines and a plurality of gate lines. The plurality of pixels R. G. and B may be disposed or arranged in a matrix form.

For example, the plurality of pixels R, G, and B may include a red subpixel 'R', a green subpixel 'G', and a blue subpixel 'B'. The plurality of pixels R, G, and B may include a white subpixel 'W'.

The side of the display module 150 on which a picture is displayed may be referred to as a front side or a front surface. When the display module 150 displays the picture, the side of the display module 150 from which the picture cannot be viewed may be referred to as a rear side or a rear surface. Meanwhile, the display module 150 may be constituted by a touchscreen, whereby an input device may also be used in addition to an output device.

The audio output unit 160 receives an audio signal processed by the controller 180 and outputs the same as audio.

The interface unit 170 serves as a path to various kinds of external devices connected to the display device 100. The interface unit may include a wireless system using an antenna as well as a wired system configured to transmit and receive data through a cable.

The interface unit 170 may include at least one of a wired/wireless headset port, an external charger port, a wired/wireless data port, a memory card port, a port for connection with a device having an identification module, an audio input/output (I/O) port, a video input/output (I/O) port, and an earphone port.

The broadcast reception unit 110 may be included as an example of the wireless system, and a mobile communication signal, a short-range communication signal, and a wireless Internet signal as well as a broadcast signal may be included.

The external device interface unit 171 may transmit or receive data to or from a connected external device. To this end, the external device interface unit 171 may include an A/V input and output unit (not shown).

The external device interface unit 171 may be connected to an external device, such as a digital versatile disc (DVD) player, a Blu-ray player, a game console, a camera, a camcorder, a computer (laptop computer), or a set-top box, in wired/wireless manner, and may perform input/output operation for the external device.

In addition, the external device interface unit 171 may establish a communication network with various remote controllers 200 in order to receive a control signal related to the operation of the display device 100 from each remote controller 200 or to transmit data related to the operation of the display device 100 to each remote controller 200.

The external device interface unit 171 may include a wireless communication unit (not shown) for short-range wireless communication with another electronic device. The external device interface unit 171 may exchange data with a mobile terminal adjacent thereto through the wireless communication unit (not shown). Particularly, in a mirroring mode, the external device interface unit 171 may receive device information, information of an application that is executed, and an image of the application from the mobile terminal.

The network interface unit 172 may provide an interface for connection of the display device 100 with a wired/wireless network including the Internet. For example, the network interface unit 172 may receive content or data provided by an Internet or content provider or a network operator through the network. Meanwhile, the network interface unit 172 may include a communication module (not shown) for connection with the wired/wireless network.

The external device interface unit 171 and/or the network interface unit 172 may include a communication module for short-range communication, such as Wi-Fi, Bluetooth, Bluetooth Low Energy (BLE), ZigBee, or Near Field Communication (NFC), or a communication module for cellular communication, such as Long-Term Evolution (LTE), LTE Advance (LTE-A), Code Division Multiple Access (CDMA), Wideband CDMA (WCDMA), Universal Mobile Telecommunications System (UMTS), or Wireless Broadband (WiBro).

The user input interface unit 173 may transmit a user input signal to the controller 180, or may transmit a signal from the controller 180 to a user. For example, the user input interface unit may transmit/receive a user input signal, such as power on/off, channel selection, or screen setting, to/from the remote controller 200, may transmit a user input signal, such as a power key, a channel key, a volume key, or a setting value, input from a local key (not shown) to the controller 180, may transmit a user input signal input from a sensor unit (not shown) configured to sense user gesture to the controller 180, or may transmit a signal from the controller 180 to the sensor unit.

The controller 180 may include at least one processor, and may control the overall operation of the display device 100 using the processor included therein. Here, the processor may be a general processor, such as a central processing unit (CPU). Of course, the processor may be a dedicated device, such as an ASIC, or another hardware-based processor.

The controller 180 may demultiplex a stream input through the tuner unit 111, the demodulation unit 112, the external device interface unit 171, or the network interface unit 172, or may process demultiplexed signals to generate and output a signal for image or audio output.

An image signal processed by the controller 180 may be input to the display module 150, which may display an image corresponding to the image signal. In addition, the image signal processed by the controller 180 may be input to an external output device through the external device interface unit 171.

An audio signal processed by the controller 180 may be output through the audio output unit 160. In addition, the audio signal processed by the controller 180 may be input to an external output device through the external device interface unit 171. Although not shown in FIG. 2, the controller 180 may include a demultiplexing unit, an image processing unit, and the like, which will be described below with reference to FIG. 3.

Further, the controller 180 may control the overall operation of the display device 100. For example, the controller 180 may control the tuner unit 111 such that a broadcast corresponding to a channel selected by a user or a pre-stored channel is tuned.

In addition, the controller 180 may control the display device 100 according to a user command input through the user input interface unit 173 or an internal program. Meanwhile, the controller 180 may control the display module 150 to display an image. At this time, the image displayed on the display module 150 may be a still image or video, or may be a 2D image or a 3D image.

Meanwhile, the controller 180 may perform control such that a predetermined 2D object is displayed in an image displayed on the display module 150. For example, the object may be at least one of a connected web screen (newspaper or magazine), an electronic program guide (EPG), various menus, a widget, an icon, a still image, video, and text.

Meanwhile, the controller 180 may modulate and/or demodulate a signal using an amplitude shift keying (ASK) method. Here, the amplitude shift keying (ASK) method may be a method of changing the amplitude of a carrier depending on a data value to modulate a signal or restoring an analog signal to a digital data value depending on the amplitude of a carrier.

For example, the controller 180 may modulate an image signal using the amplitude shift keying (ASK) method, and may transmit the modulated image signal through a wireless communication module.

For example, the controller 180 may demodulate and process an image signal received through the wireless communication module using the amplitude shift keying (ASK) method.

As a result, the display device 100 may easily transmit and receive a signal to and from another image display device disposed adjacent thereto without using a unique identifier, such as a media access control (MAC) address, or a complicated communication protocol, such as TCP/IP.

Meanwhile, the display device 100 may further include a photographing unit (not shown). The photographing unit may photograph a user. The photographing unit may be implemented by one camera; however, the present disclosure is not limited thereto. The photographing unit may be implemented by a plurality of cameras. Meanwhile, the photographing unit may be embedded in the display device 100 above the display module 150, or may be separately disposed. Image information photographed by the photographing unit may be input to the controller 180.

The controller 180 may recognize the location of a user based on an image captured by the photographing unit. For example, the controller 180 may recognize the distance between the user and the display device 100 (z-axis coordinate). Further, the controller 180 may recognize an x-axis coordinate and a y-axis coordinate in the display module 150 corresponding to the location of the user.

The controller 180 may sense user gesture based on the image captured by the photographing unit, a signal sensed by the sensor unit, or a combination thereof.

The power supply unit 190 may supply power to the components of the display device 100. In particular, the power supply unit may supply power to the controller 180, which may be implemented in the form of a system on chip (SOC), the display module 150 for image display, and the audio output unit 160 for audio output.

Specifically, the power supply unit 190 may include an AC/DC converter (not shown) configured to convert AC power into DC power and a DC/DC converter (not shown) configured to convert the level of the DC power.

Meanwhile, the power supply unit 190 serves to distribute power supplied from the outside to the respective components of the display device. The power supply unit 190 may be directly connected to an external power supply in order to supply AC power, or may include a battery so as to be used by charging.

In the former case, a cable is used, and the power supply unit is difficult to move or the movement range of the power supply unit is limited. In the latter case, the power supply unit is free to move, but the weight of the power supply unit is increased in proportion to the weight of the battery, the volume of the power supply unit is increased, and, for charging, the power supply unit must be directly connected to a power cable or must be coupled to a charging holder (not shown) that supplies power for a predetermined time.

The charging holder may be connected to the display device through a terminal exposed to the outside, or the battery mounted in the power supply unit may be charged in a wireless manner when the power supply unit approaches the charging holder.

The remote controller 200 may transmit user input to the user input interface unit 173. To this end, the remote controller 200 may use Bluetooth communication, radio frequency (RF) communication, infrared radiation communication, ultra-wideband (UWB) communication, or ZigBee communication. In addition, the remote controller 200 may receive an image, audio, or data signal output from the user input interface unit 173 so as to be displayed thereon or audibly output therefrom.

Meanwhile, the display device 100 may be a stationary or movable digital broadcast receiver capable of receiving a digital broadcast.

Meanwhile, the block diagram of the display device 100 shown in FIG. 1 is for an embodiment of the present disclosure, and elements of the block diagram may be integrated, added, or omitted depending on specifications of an actually implemented display device 100.

That is, two or more elements may be integrated into one element, or one element may be divided into two or more elements, as needed. In addition, the function performed by each block is for describing the embodiment of the present disclosure, and the specific operations and components thereof do not limit the scope of rights of the present disclosure.

Figure 2:
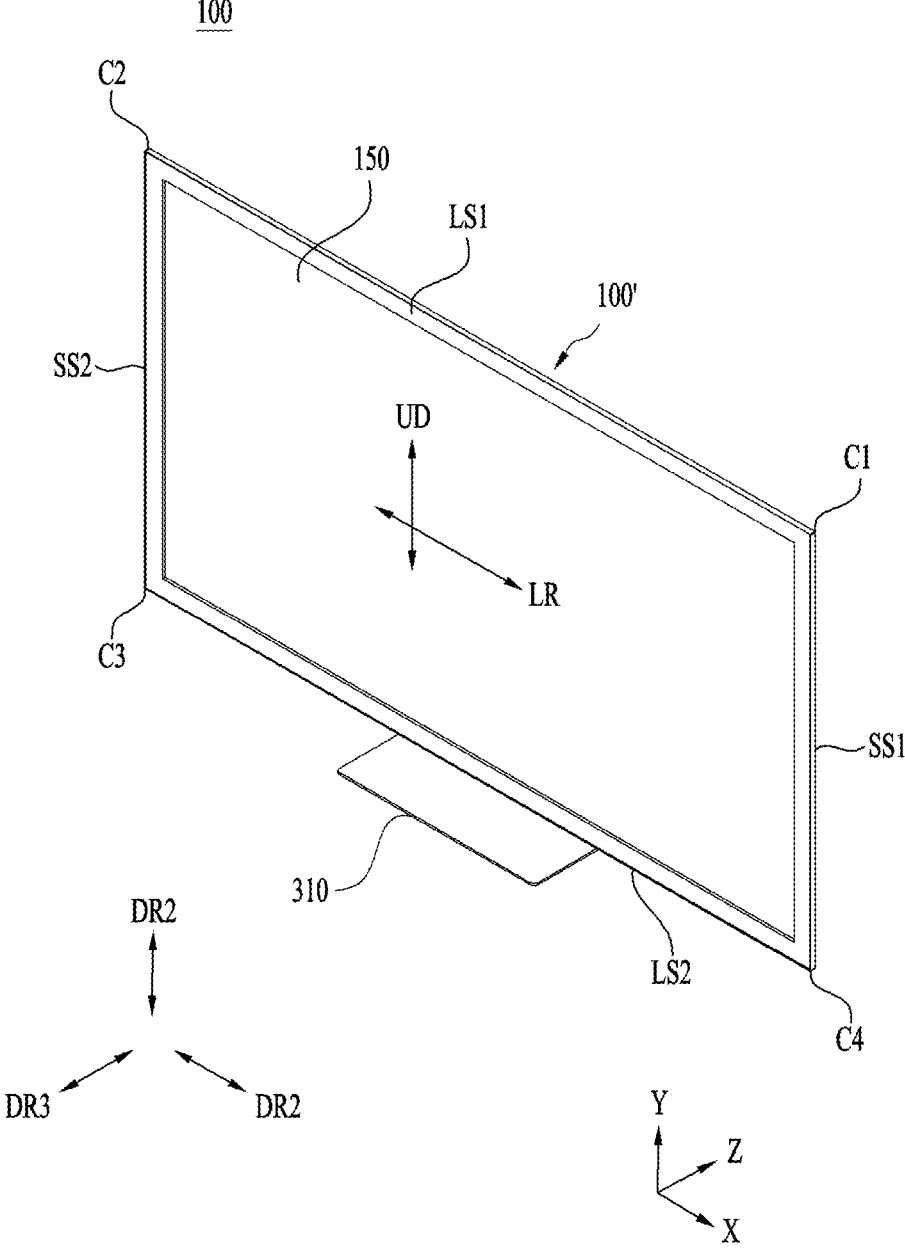
FIG. 2 is a perspective view showing an example of the display device according to the present disclosure.

FIG. 2 is a front perspective view showing an example of the display device.

Referring to FIG. 2, the display device 100 may have a rectangular shape including a first long side LS1, a second long side LS2 opposite the first long side LS1, a first short side SS1 adjacent to the first long side LS1 and the second long side LS2, and a second short side SS2 opposite the first short side SS1.

Here, the area of the first short side SS1 may be referred to as a first side area, the area of the second short side SS2 may be referred to as a second side area opposite the first side area, the area of the first long side LS1 may be referred to as a third side area adjacent to the first side area and the second side area and located between the first side area and the second side area, and the area of the second long side LS2 may be referred to as a fourth side area adjacent to the first side area and the second side area, located between the first side area and the second side area, and opposite the third side area.

In addition, the lengths of the first and second long sides LS1 and LS2 are shown and described as being greater than the lengths of the first and second short sides SS1 and SS2, for convenience of description; however, the lengths of the first and second long sides LS1 and LS2 may be approximately equal to the lengths of the first and second short sides SS1 and SS2.

Also, in the following description, a first direction DR1 may be a direction parallel to the long sides LS1 and LS2 of the display device 100, and a second direction DR2 may be a direction parallel to the short sides SS1 and SS2 of the display device 100. A third direction DR3 may be a direction perpendicular to the first direction DR1 and/or the second direction DR2.

From a different point of view, the side of the display device 100 on which a picture is displayed may be referred to as a front side or a front surface. When the display device 100 displays the picture, the side of the display device 100 from which the picture cannot be viewed may be referred to as a rear side or a rear surface. When viewing the display device 100 from the front side or the front surface, the side of the first long side LS1 may be referred to as an upper side or an upper surface. In the same manner, the side of the second long side LS2 may be referred to as a lower side or a lower surface. In the same manner, the side of the first short side SS1 may be referred to as a right side or a right surface, and the side of the second short side SS2 may be referred to as a left side or a left surface.

In addition, the first long side LS1, the second long side LS2, the first short side SS1, and the second short side SS2 may be referred to edges 351 of the display device 100. In addition, points at which the first long side LS1, the second long side LS2, the first short side SS1, and the second short side SS2 are joined to each other may be referred to as corners. For example, a point at which the first long side LS1 and the first short side SS1 are joined to each other may be a first corner C1, a point at which the first long side LS1 and the second short side SS2 are joined to each other may be a second corner C2, a point at which the second short side SS2 and the second long side LS2 are joined to each other may be a third corner C3, and a point at which the second long side LS2 and the first short side SS1 are joined to each other may be a fourth corner C4.

Here, a direction from the first short side SS1 to the second short side SS2 or a direction from the second short side SS2 to the first short side SS1 may be referred to as a leftward-rightward direction LR. A direction from the first long side LS1 to the second long side LS2 or a direction from the second long side LS2 to the first long side LS1 may be referred to as a vertical direction UD.

A stand 310 supporting a main body 100' is located under the main body 100', and the main body 100' is lighter than a main body 100' of an existing display device 100, so that a slim and simple design of the stand 310 is also preferred.

In addition, as the display device 100 becomes thinner, it is difficult to secure a space for mounting an audio output module such as a speaker, so that the audio output module is omitted or a speaker with poor sound quality is built in.

Therefore, to place a separate sound bar at a bottom, a type of the stand 310 with a flat and thin base 316 may be preferred, and a design in which a portion connecting the base 316 with the main body 100' is also located slightly toward the rear rather than directly vertical to secure a space at the front may be preferred.

Figure 3:
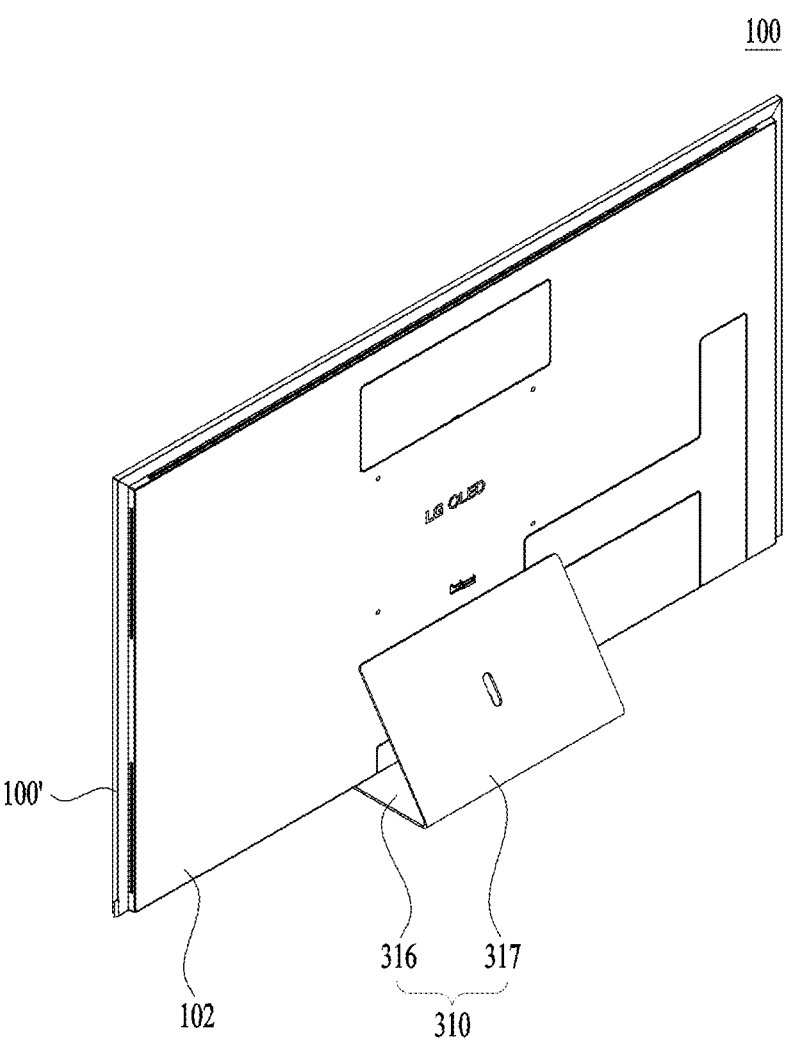
FIG. 3 is a rear view showing an example of a display device of the present disclosure.

FIG. 3 is a rear view showing an example of the display device 100 of the present disclosure. The stand 310 of the present disclosure may be attached to a cover bottom 102 of the display device 100 while the base 316 and a support 317 are bent at an angle equal to or smaller than 90° to form an L-shape.

Figure 4:
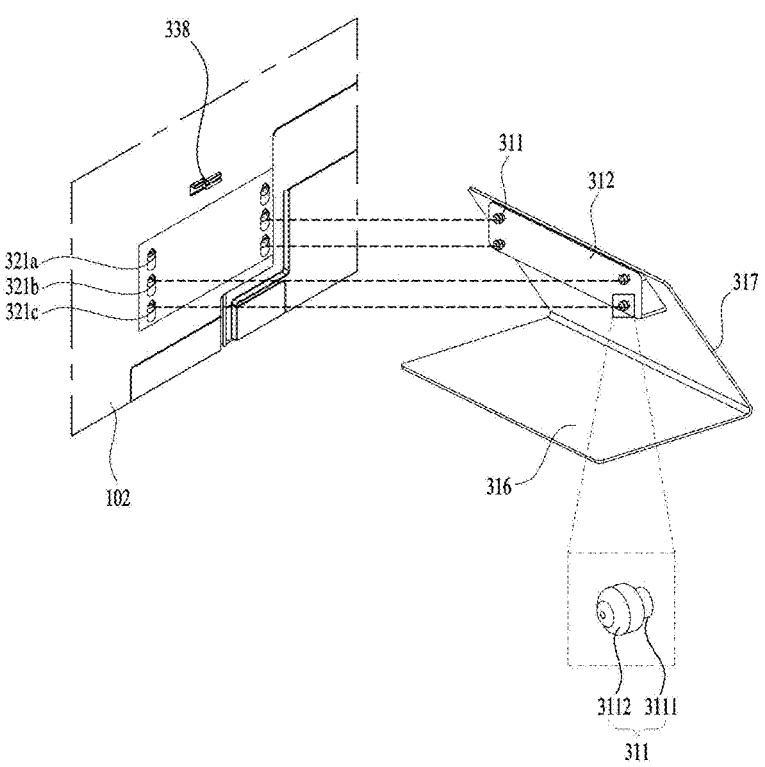
FIG. 4 is a view showing a state in which a stand according to an example of a display device of the present disclosure is separated from a main body.

FIG. 4 is a view showing a state in which the stand 310 according to an example of the display device 100 of the present disclosure is separated from the main body 100'. The stand 310 may be separated from the main body 100'.

A fastening hole 321 of the stand 310 for being coupled with the stand 310 is defined in the cover bottom 102, which is a rear surface of the main body 100. A fastening protrusion protruding from a front surface of the stand 310 may be inserted into the fastening hole 321 of the stand 310.

A fastening protrusion 311 protrudes from the front surface of the stand, and an end of the fastening protrusion 311 includes an expanded head 3112. The fastening protrusion 311 may not necessarily have to be circular, but may have the circular shape to minimize directionality during fastening.

A body 3111 that is thinner than the head 3112 is a portion located in the fastening hole 321 when being fastened to the fastening hole 321. When mounted, the head 3112 may be in contact with a front circumference of the fastening hole 321 to prevent the fastening protrusion 311 from falling out of the fastening hole 321.

A plurality of fastening protrusions 311 may be included so as to be coupled without shaking in vertical and horizontal directions, and may be arranged in a 2×2 configuration as shown in FIG. 4.

The number of fastening holes 321 may greater than the number of fastening protrusions 311. As shown in FIG. 4, when the fastening protrusions 311 are arranged in the 2×2 configuration, the fastening holes 321 may be arranged in a 2×3 configuration with a greater number in the vertical direction than the 2×2 configuration, or may be additionally defined in the vertical direction.

To position the stand 310 at a center of the main body 100', a horizontal location of the stand 310 may be fixed, but a vertical fastening location thereof may be varied to vary a vertical level of the main body 100'.

Gaps between vertical fastening holes 321a, 321b, and 321c may be equal to each other, so that the fastening protrusions 311 may be fastened using the fastening holes 321a and 321b of first and second rows or using the fastening holes 321b and 321c of second and third rows.

When the vertical level of the main body 100' is increased, there may be more space to place the sound bar at the bottom, and when the vertical level of the main body 100' is lowered, the display device 100 may be more stably mounted.

However, because it is difficult for the stand 310 to stably support the main body 100' when a center of gravity is too high, the present embodiment will be described based on the embodiment in which an additional row of fastening holes 321 is formed in the vertical direction.

Figure 5:
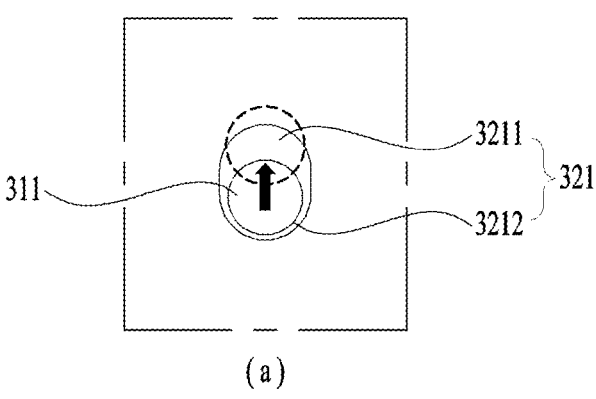
FIG. 5 is a view showing a fastening protrusion and a fastening hole of a display device of the present disclosure.
Figure 5:
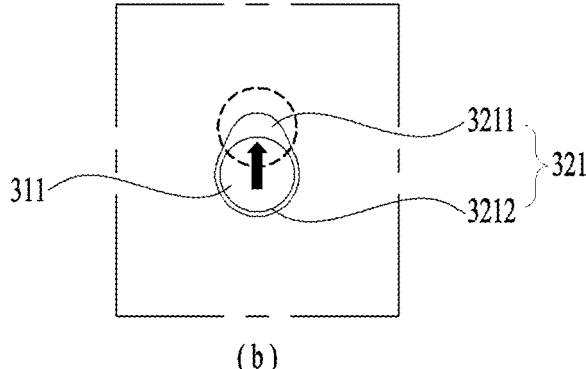

FIG. 5 is a view illustrating the fastening hole 321 according to an example of the display device 100 of the present disclosure. The fastening hole 321 may have a size greater than a size of the fastening protrusion 311 such that the head of the fastening protrusion 311 may be inserted thereinto.

As shown in (a) in FIG. 5, the fastening hole 321 may have a width greater than that of the fastening protrusion 311 such that the fastening protrusion 311 may be inserted thereinto, and the fastening hole 321 may have a shape with a vertical length equal to or greater than the width.

As shown in (a) in FIG. 5, after the fastening protrusion 311 is inserted into the fastening hole 321, the main body 100' moves downward because of an own weight, and the fastening protrusion 311 moves upward within the fastening hole 321.

The head of the fastening protrusion 311 extends through the fastening hole 321 and is located on a front surface of the cover bottom 102, and the thin portion of the fastening protrusion 311 touches an upper end of the fastening hole 321, so that the fastening protrusion 311 does not deviate from the fastening hole 321 as the head of the fastening protrusion 311 is caught on the upper end of the fastening hole 321.

As shown in (b) in FIG. 5, the fastening protrusion 311 may have a water droplet shape in which an upper end 3211 is smaller than a lower end 3212. When the fastening protrusion 311 is inserted into the lower end 3212 of the fastening hole 321 and then moves to the upper end 3211, because the head of the fastening hole 321 is greater than the fastening hole 321 even in the horizontal direction, the fastening protrusion 311 may maintain a state of being more stably inserted into the fastening hole 321.

However, when the display module is moved or rotated, the main body 100' may be lifted and thus the fastening protrusion 311 may be separated from the fastening hole 321. To maintain the state in which the stand 310 is fastened to the main body 100', a locking member 330 that fills a remaining space of the fastening hole 321, that is, a gap between the fastening protrusion 311 and the fastening hole 321, after the fastening protrusion 311 is inserted may be further disposed.

Figure 6:
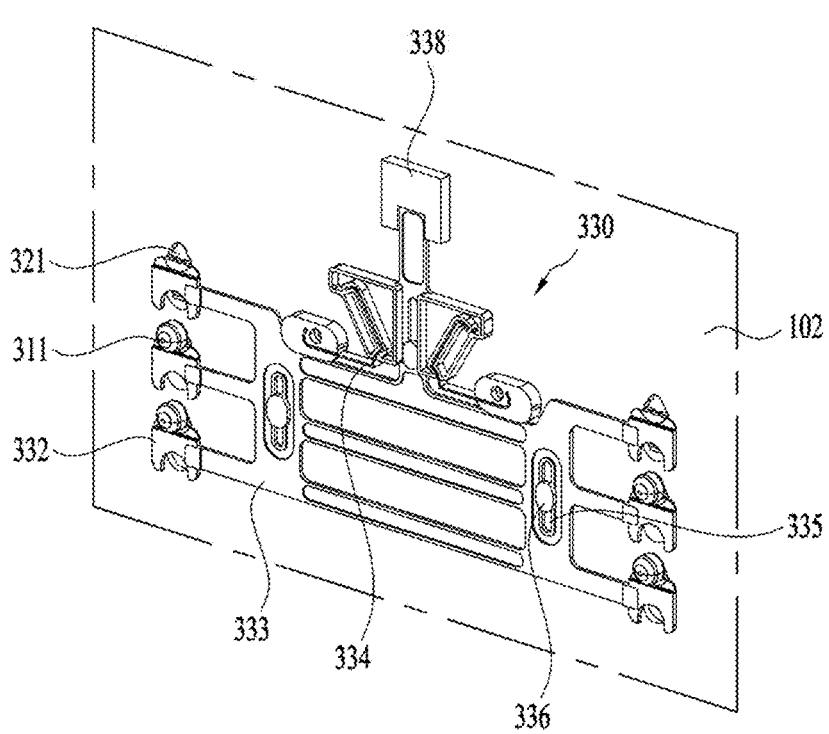
FIG. 6 is a front view showing a stand locking member of a display device of the present disclosure.

FIG. 6 is a front view showing a stand locking member of a display device of the present disclosure. The locking member 330 of the present embodiment may be located at a side of the main body 100' and may be located on an inner area of the cover bottom 102.

As shown in FIG. 6, the locking member is located on the front surface of the cover bottom 102. The locking member may include a slide block 332 that partially covers the fastening hole 321, and the slide block 332 may slide such that an amount of overlap with the fastening hole 321 changes.

The slide block 332 may slide to selectively cover a lower side of the fastening hole 321, and may slide horizontally or move in a curved manner. In the present embodiment, a form in which the slid block 332 moves vertically is shown.

When an overlapping area between the slide block 332 and the fastening hole 321 is small, a size of an open portion of the fastening hole 321 is great, so that the fastening protrusion 311 may be inserted. On the other hand, when the overlapping area is great, the open portion of the fastening hole 321 is small, so that the fastening protrusion 311 is fixed in the state of being located at the upper end of the fastening hole 321. An upper end of the slide block 332 may be constructed to form a curve in a form of surrounding the lower portion of the fastening protrusion 311.

Although not shown in the drawing, the cover bottom 102 may have a groove defined in the front surface thereof such that the slide block 332 may be accommodated, or the slide block 332 may include a protrusion protruding rearward and the cover bottom 102 may include a groove extending vertically at a location corresponding to the protrusion.

The number of slide blocks 332 may correspond to the number of plurality of fastening holes 321, and a moving frame 333 may be included that connects the plurality of slide blocks 332 to each other such that the slide blocks 332 may be operated simultaneously.

The moving frame 333 may be connected to a locking button 338, so that a user may move the slide block 332 by manipulating the locking button 338. In the present embodiment, the slide block 332 and the moving frame 333 may move linearly in the vertical direction.

A guide slot 335 extending in the vertical direction to assist the sliding movement of the moving frame 333 may be included. A guide protrusion 336 that is inserted into the guide slot 335 and protrudes forward from the cover bottom 102 may be included. The slide slot may include a plurality of slide slots to guide more stable vertical movement.

The locking button 338 connected to the slide frame and exposed rearward of the cover bottom 102 may be included.

Figure 7:
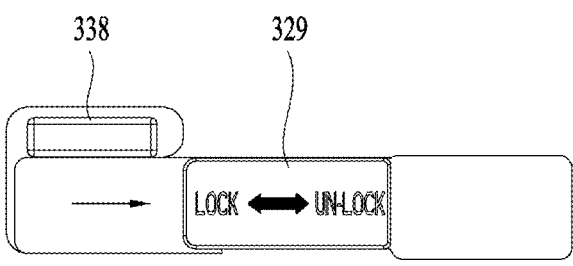
FIG. 7 is a view showing an embodiment of a locking button of a display device of the present disclosure.
Figure 7:
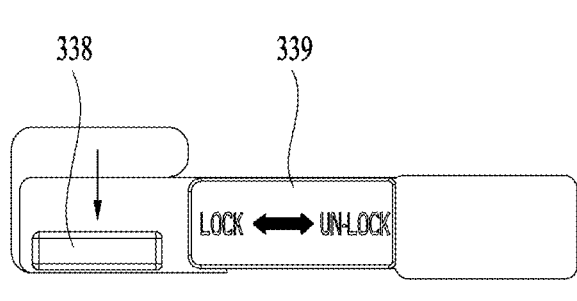
Figure 7:
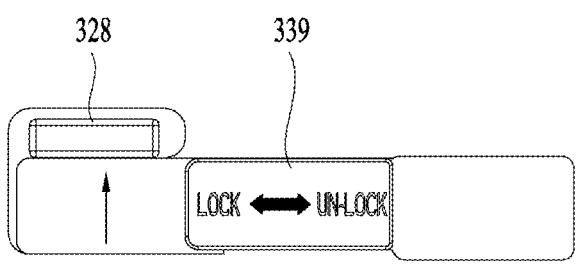
Figure 7:
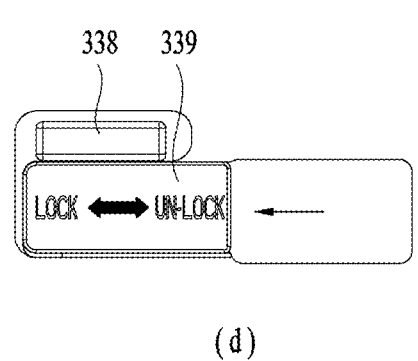

FIG. 7 is a view showing an embodiment of the locking button 338 of a display device of the present disclosure. The locking button 338 may include a switch protrusion 338s protruding rearward such that the user may press the locking button 338 in the vertical direction.

When the switch protrusion 338s is pressed from a state (a) in FIG. 7 to a state (b), the moving frame 333 moves downward.

Figure 8:
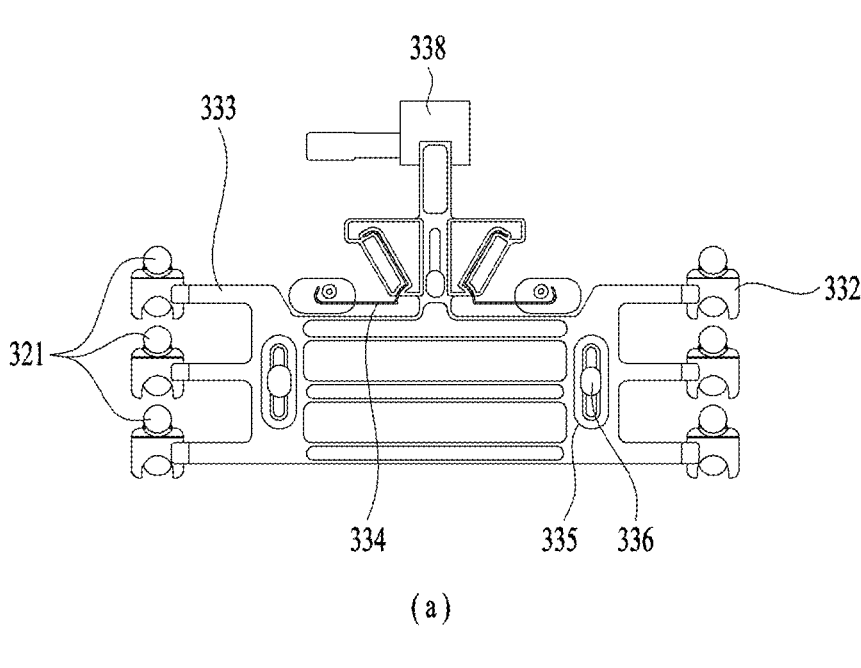
FIG. 8 is a view showing an operation of a stand locking member in FIG. 7.
Figure 8:
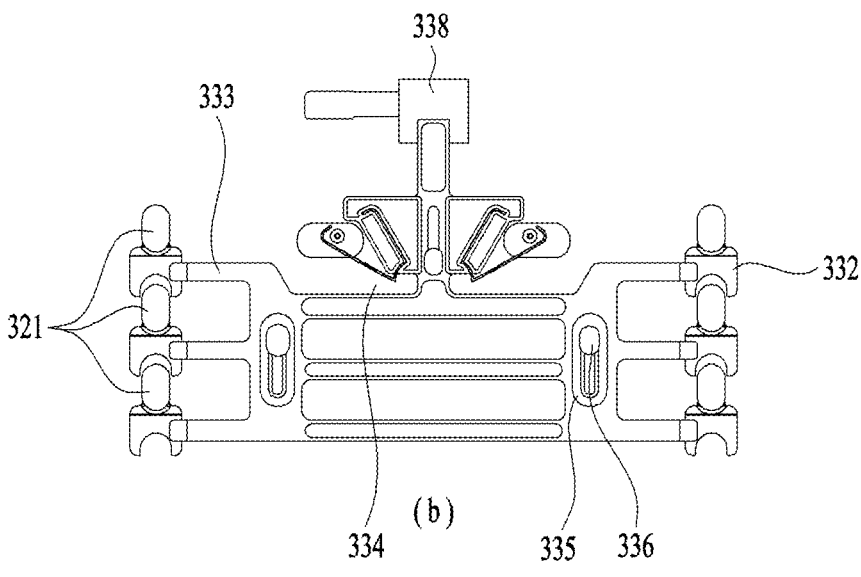

FIG. 8 is a view showing an operation of a stand locking member in FIG. 7, and shows changes in the moving frame 333 and the slide block 332.

(a) in FIG. 8 shows the moving frame 333 and the slide block 332 corresponding to the state in which the switch protrusion 338s is positioned at an upper side as in (a) in FIG. 7. (b) in FIG. 8 shows that the switch protrusion 338s is pressurized downward as in (b) in FIG. 7, and the fastening hole 321 is further opened as the moving frame 333 and the slide block 332 are moved further downward compared to the state shown in (a) in FIG. 8.

When the fastening hole 321 is expanded, the fastening protrusion 311 may be inserted thereinto. When the slide block 332 is moved again to be in the state as in (a) in FIG. 8, the gap between the fastening hole 321 and the fastening protrusion 311 is covered by the slide block 332, so that the fastening protrusion 311 may not be deviated from the fastening hole 321.

A return spring 334 may be further disposed such that the slide block 332 maintains the state of being moved upward as in FIG. 6 or (a) in FIG. 8. A plate spring in which one side of the return spring 334 is fixed to the cover bottom 102 and the other side thereof is fastened to the moving frame 333 may be used. The return spring 334 provides elasticity such that the moving frame 333 returns to an original location thereof.

When the switch protrusion 338s is pressurized, the moving frame 333 moves downward, so that the return spring 334 may change a shape thereof. On the other hand, when the force is removed, the switch protrusion 338s may provide the elasticity such that the moving frame 333 returns to the original location thereof again.

When the moving frame 333 returns, the switch protrusion 338s moves upward as in (c) in FIG. 7. When the slide block 332 slides upward, the fastening protrusion 311 is positioned at the upper end of the fastening hole 321, and the slide block 332 covers the remaining space beneath the fastening protrusion 311.

To maintain such state, a stopper 339 may be further disposed as in (d) in FIG. 7 to prevent the switch protrusion 338s from moving downward as in (b).

Because the slide block 332 and the moving frame 333 are not able to move downward because of the stopper 339, even when there is no force of the return spring pushing the slide frame upward, the fastening protrusion 311 is not deviated from the fastening hole 321.

Figure 9:
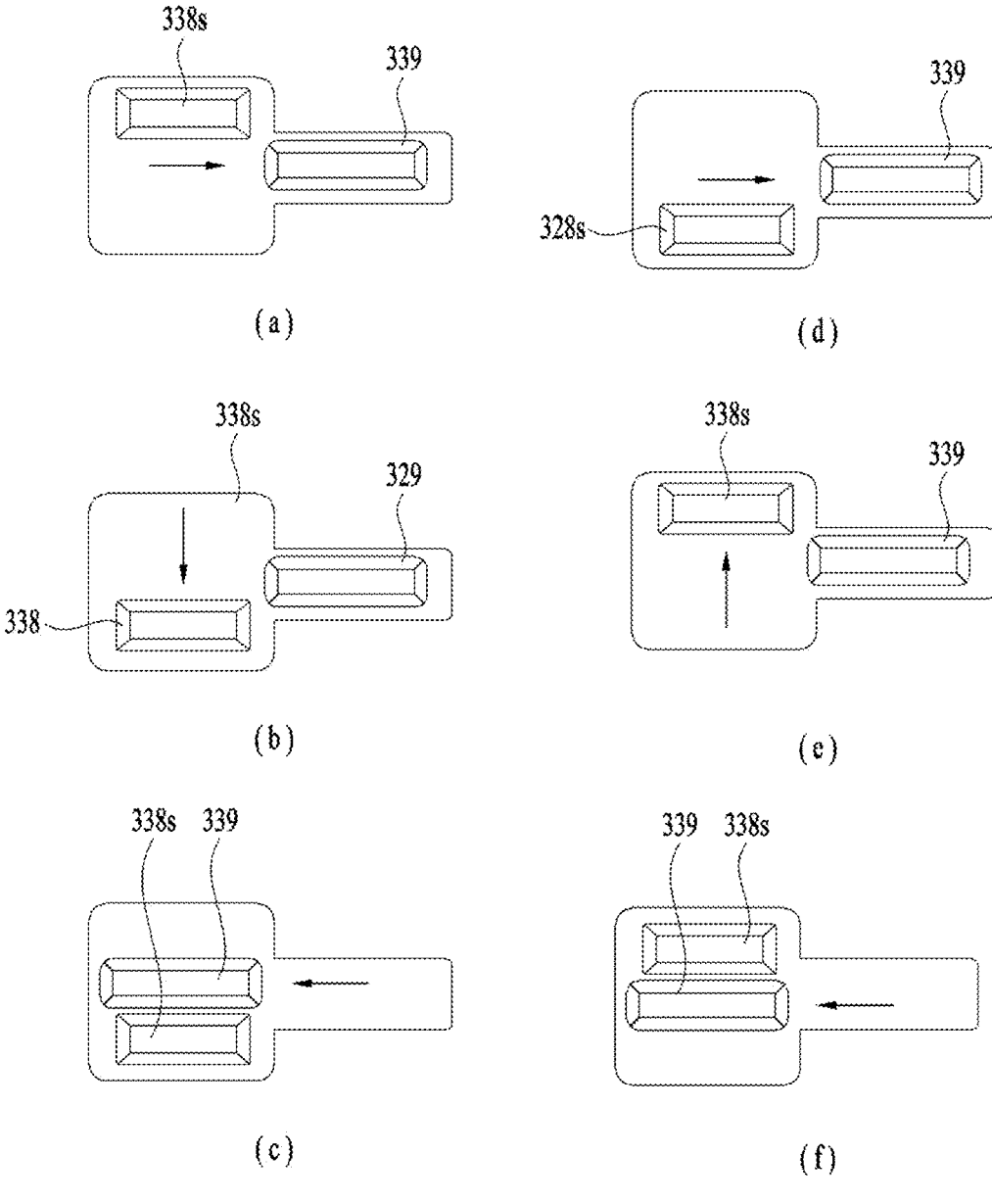
FIG. 9 is a view showing another embodiment of a locking button of a display device of the present disclosure.

FIG. 9 shows another embodiment of the locking button 338 according to an example of a display device of the present disclosure, in which the stopper 339 may be positioned at a center of a section of the locking button 338.

Therefore, after moving the switch protrusion 338s from a state in (a) in FIG. 9 to (b), the stopper 339 is placed on the switch protrusion 338s as in (c) to block the switch protrusion 338s from moving upward. In this case, even when the user does not hold the switch protrusion 338s, because the slide block 332 is located at the lower side and the fastening hole 321 is kept open, the fastening protrusion 311 may be easily inserted into the fastening hole 321.

Thereafter, the switch protrusion 338s may be released again as in (d) in FIG. 9, then the switch protrusion 338s may be moved upward as in (e), and then the stopper 339 may be placed beneath the switch protrusion 338s as in (f) to fix the switch protrusion 338s in the state of being located at the upper side. The slide block 332 may maintain the state of covering the fastening hole 321, so that the fastening protrusion 311 may be fixed to the fastening hole 321.

Figure 10:
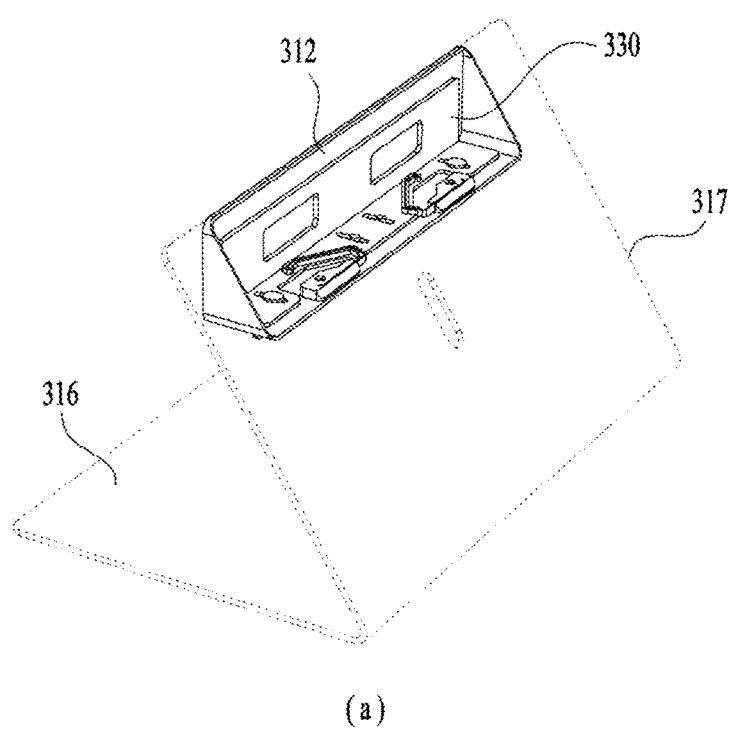
FIG. 10 is a view showing another example of a stand of a display device of the present disclosure.
Figure 10:
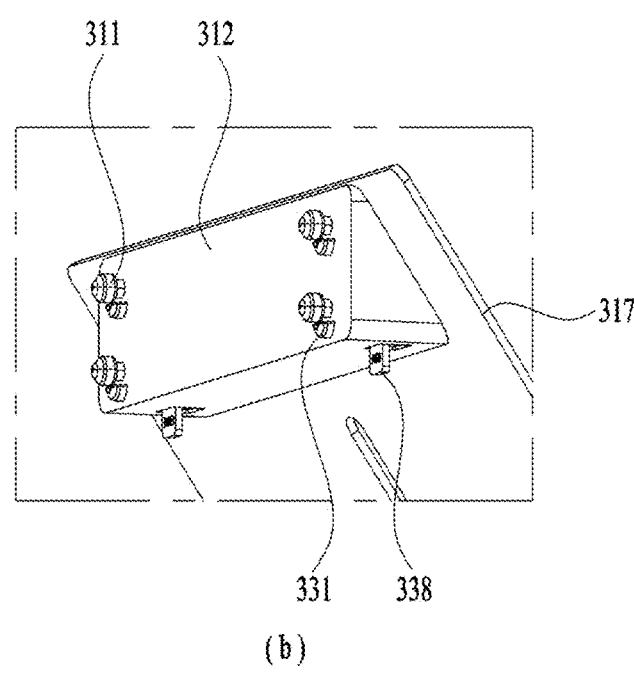

FIG. 10 is a view showing the stand 310 according to another example of the display device 100 of the present disclosure. (a) is a rear perspective view and (b) is a front perspective view.

The locking member 330 of the present embodiment is positioned on the stand 310. The stand 310 may include the base 316 in contact with a floor surface, the support 317 extending upward from the base 316, and a bracket 312 having the fastening protrusion 311 protruding therefrom that is located at an end of the support 317 and fastened to the rear surface of the main body 100'.

The bracket 312 may have a triangular prism shape such that a surface on which the fastening protrusion 311 is formed at a front side forms a vertical surface corresponding to the inclined angle of the support 317.

The locking member 330 of the present embodiment includes a fixing protrusion 331 located below the fastening protrusion 311. The fixing protrusion 331 is inserted into and withdrawn from the bracket 312 at the location below the fastening protrusion 311. The fixing protrusion 331 is inserted when the fastening protrusion 311 is inserted into the fastening hole 321, and protrudes to fill the gap between the fastening hole 321 and the fastening protrusion 311 after the fastening protrusion 311 is fastened to the fastening hole 321.

For the insertion and the withdrawal of the fixing protrusion 331, the moving frame 333 located in an internal space of the bracket 312 may be included as shown in (a) in FIG. 10, and the moving frame 333 may be connected to a plurality of fixing protrusions 331.

Figure 11:
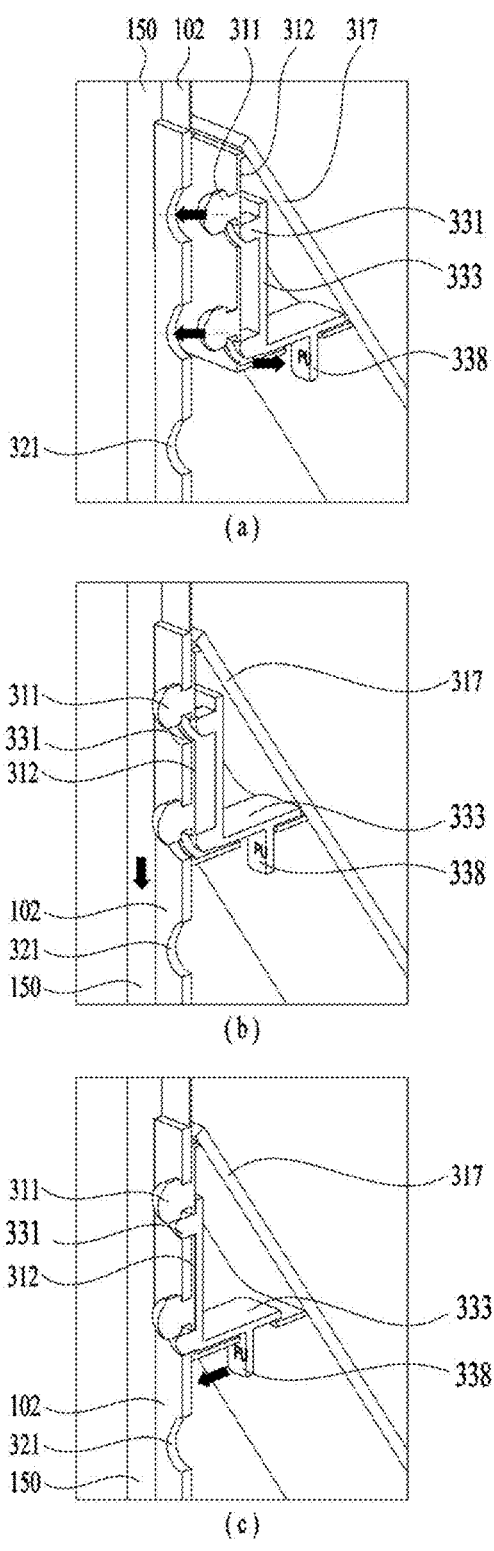
FIG. 11 is a view showing a process of fastening a stand in FIG. 10 to a main body of a display device.

FIG. 11 is a view showing a process of fastening the stand 310 in FIG. 10 to the main body 100' of the display device 100.

To insert the fixing protrusion 331 into the bracket 312, the moving frame 333 may include the locking button 338 protruding outward of the bracket 312. The locking button 338 of the present embodiment may be located at a bottom of the bracket 312. As shown in (a) in FIG. 11, when the user presses the locking button 338 rearward, the moving frame 333 may move rearward and the fixing protrusion 331 may be inserted into the bracket 312.

Figure 12:
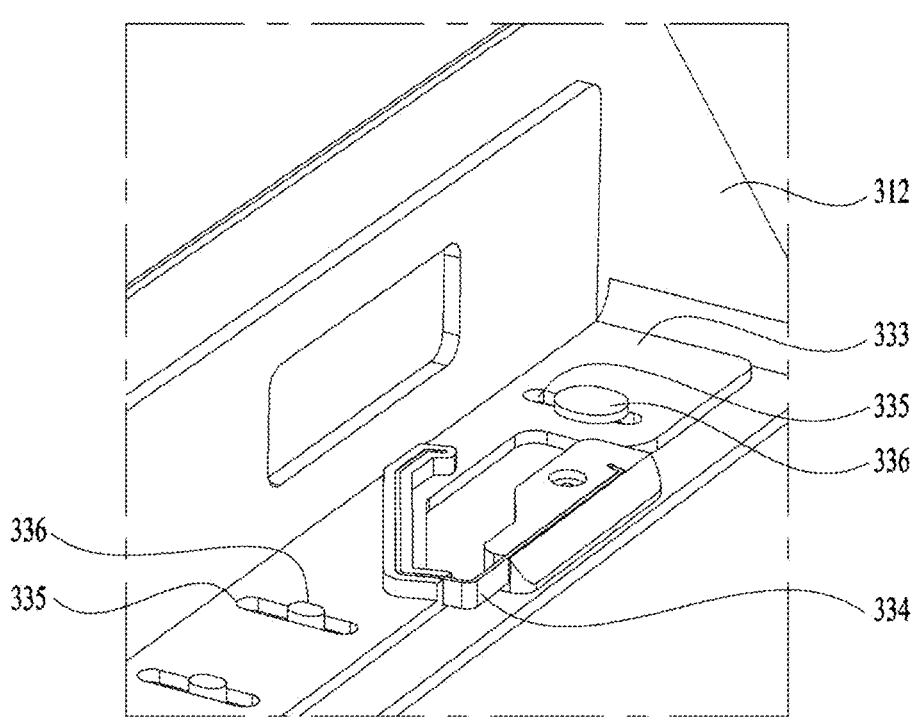
FIG. 12 is an enlarged view of a locking member in FIG. 10.

As shown in (b), when the main body 100' moves downward after inserting the fastening protrusion 311 into the fastening hole 321, the fastening protrusion 311 comes into contact with the upper end of the fastening hole 321. Thereafter, as shown in (c), when the force of the user of pressing the fixing button is removed, the fixing protrusion 331 protrudes at the location below the fastening protrusion 311 and fills the gap with the fastening hole 321 located under the fastening protrusion 311. FIG. 12 is an enlarged view of the locking member 330 in FIG. 10. The return spring 334 that presses the moving frame 333 forward such that the fixing protrusion 331 may be maintained in the state of being inserted into the fastening hole 321 may be further included.

The return spring 334 is in the plate spring shape, one side of which is fixed to the bracket 312 and the other side to the moving frame 333. The return spring 334 is compressed when being pressurized by the user, and returns to the original shape thereof and moves the moving frame 333 and the fixing protrusion 331 forward when the force of the user of pressing the locking button 338 is removed.

To guide the linear movement in the front and rear direction of the moving frame 333, the guide slot 335 defined in the moving frame 333 and the guide protrusion 336 inserted into the guide slot 335 and protruding from the bracket 312 may be included.

The display device 100 of the present disclosure is able to easily fasten the stand 310 even when using the stand with the simple structure, and at the same time, stably mount the main body 100'. The detailed description above should not be construed as restrictive in all respects but should be considered illustrative. The scope of the present disclosure should be determined by a reasonable interpretation of the appended claims, and all changes within the equivalency range of the present disclosure are intended to be included within the scope of the present disclosure.

What is claimed is:

1. A display device comprising:
a display module;
a cover bottom positioned on a rear surface of the display module;
a stand fastening hole defined in the cover bottom;
a stand including a stand fastening protrusion inserted into the stand fastening hole; and
a locking member fixing the stand fastening protrusion to the stand fastening hole, wherein the locking member includes:
 a slide block located on a front surface of the cover bottom and partially covering the stand fastening hole; and
 a locking button configured to move the slide block in a vertical direction,
wherein the stand fastening hole is larger than the stand fastening protrusion when the slide block moves downward, and
wherein the stand fastening hole is smaller than the stand fastening protrusion when the slide block moves upward.

2. The display device of claim 1, wherein the stand fastening hole, the stand fastening protrusion, and the slide block include a plurality of stand fastening holes, a plurality of stand fastening protrusions, and a plurality of slide blocks, respectively, wherein the locking member includes a moving frame connecting the plurality of slide blocks to each other, and wherein the locking button is connected to the moving frame and moves the plurality of slide blocks simultaneously.

3. The display device of claim 2, further comprising a return spring having one side fixed to the cover bottom and the other side fixed to the moving frame, wherein when the locking button is pressed, a shape of the return spring changes and the slide block moves downward, and wherein when the force of pressing the locking button is removed, the return spring is restored to an original shape thereof and the slide block moves upward.

4. The display device of claim 2, further comprising:

a guide slot extending in the vertical direction in the frame; and a guide protrusion protruding in a direction of the front surface of the cover bottom and inserted into the guide slot.

5. The display device of claim 1, wherein the locking button includes a switch protrusion protruding in a direction of a rear surface of the cover bottom, wherein the locking member further includes a stopper supporting a lower portion of the switch protrusion to maintain the slide block in the upwardly moved state.

6. A display device comprising:

a display module;

a cover bottom positioned on a rear surface of the display module;

a stand fastening hole defined in the cover bottom;

a stand including a stand fastening protrusion inserted into the stand fastening hole; and a locking member fixing the stand fastening protrusion to the stand fastening hole, wherein the locking member includes:

a fixing protrusion positioned below the stand fastening protrusion; and a locking button configured to insert and withdraw the fixing protrusion into and from a front surface of the stand, and wherein the fixing protrusion is inserted into the stand fastening hole while filling a gap between the stand fastening protrusion and the stand fastening hole.

7. The display device of claim 6, further comprising a return spring configured to press the fixing protrusion such that the fixing protrusion protrudes from the front surface of the stand, wherein when the locking button is pressed, the return spring is compressed and the fixing protrusion is inserted into the stand, and wherein when the force of pressing the locking button is removed, the return spring is restored to an original shape thereof and the fixing protrusion protrudes from the front surface of the stand.

8. The display device of claim 6, wherein the stand fastening hole, the stand fastening protrusion, and the fixing protrusion include a plurality of stand fastening holes, a plurality of stand fastening protrusions, and a plurality of fixing protrusions, wherein the locking member includes a moving frame connecting the plurality of fixing protrusions to each other, and wherein the locking button is connected to the moving frame and moves the plurality of fixing protrusions simultaneously.

* * * * *